(12) United States Patent
Haba

(10) Patent No.: US 12,341,025 B2
(45) Date of Patent: *Jun. 24, 2025

(54) MICROELECTRONIC ASSEMBLIES

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/733,052

(22) Filed: Jun. 4, 2024

(65) Prior Publication Data

US 2025/0046625 A1 Feb. 6, 2025

Related U.S. Application Data

(63) Continuation of application No. 17/937,593, filed on Oct. 3, 2022, now Pat. No. 12,046,482, which is a (Continued)

(51) Int. Cl.
*H01L 21/56* (2006.01)
*H01L 21/768* (2006.01)
(Continued)

(52) U.S. Cl.
CPC ...... *H01L 21/565* (2013.01); *H01L 21/76819* (2013.01); *H01L 21/76877* (2013.01);
(Continued)

(58) Field of Classification Search
CPC .. H10D 62/102; H10D 30/665; H10D 30/668; H10D 62/8325; H10D 64/512;
(Continued)

(56) References Cited

U.S. PATENT DOCUMENTS 4,998,665 A 3/1991 Hayashi
5,019,673 A 5/1991 Juskey et al.
(Continued)

FOREIGN PATENT DOCUMENTS

CN 103681646 3/2014
CN 104078414 A 10/2014
(Continued)

OTHER PUBLICATIONS

"Die-to-Wafer Fusion and Hybrid Bonding," EV Group, https://www.evgroup.com/technologies/die-to-wafer-fusion-and-hybrid-bonding/, printed Sep. 21, 2022, 8 pages.
(Continued)

*Primary Examiner* — Cuong B Nguyen
(74) *Attorney, Agent, or Firm* — Knobbe, Martens, Olson & Bear, LLP

(57) ABSTRACT

Various embodiments of fanout packages are disclosed. A method of forming a microelectronic assembly is disclosed. The method can include bonding a first surface of at least one microelectronic substrate to a surface of a carrier using a direct bonding technique without an intervening adhesive, the microelectronic substrate having a plurality of conductive interconnections on at least one surface of the microelectronic substrate. The method can include applying a molding material to an area of the surface of the carrier surrounding the microelectronic substrate to form a reconstituted substrate. The method can include processing the microelectronic substrate. The method can include singulating the reconstituted substrate at the area of the surface of the carrier and at the molding material to form the microelectronic assembly.

20 Claims, 7 Drawing Sheets

Related U.S. Application Data continuation of application No. 16/503,021, filed on Jul. 3, 2019, now Pat. No. 11,462,419.

(60) Provisional application No. 62/694,543, filed on Jul. 6, 2018.

(51) Int. Cl.
    *H01L 23/31*     (2006.01)
    *H01L 23/528*     (2006.01)
    *H10D 84/01*     (2025.01)

(52) U.S. Cl.
CPC ........ *H01L 23/3107* (2013.01); *H01L 23/528* (2013.01); *H10D 84/01* (2025.01); *H01L 2224/02379* (2013.01)

(58) Field of Classification Search
CPC .... H10D 30/66; H10D 12/031; H10D 62/393; H10D 62/157; H10D 62/111; H10D 62/107; H10D 30/63; H01L 21/565; H01L 21/76819; H01L 21/76877; H01L 21/82; H01L 23/3107; H01L 23/528; H01L 2224/02379; H01L 2224/18; H01L 21/568; H01L 24/18; H01L 24/19; H01L 24/20; H01L 24/97; H01L 25/0657; H01L 25/50; H01L 23/3114; H01L 2225/06524; H01L 2225/06541; H01L 2225/06565; H01L 21/561

See application file for complete search history.

(56) References Cited

U.S. PATENT DOCUMENTS

| | | | |
|---|---|---|---|
| 5,051,802 | A | 9/1991 | Prost et al. |
| 5,087,585 | A | 2/1992 | Hayashi |
| 5,322,593 | A | 6/1994 | Hasegawa et al. |
| 5,729,896 | A | 3/1998 | Dalal et al. |
| 5,753,536 | A | 5/1998 | Sugiyama et al. |
| 5,771,555 | A | 6/1998 | Eda et al. |
| 5,854,507 | A | 12/1998 | Miremadi et al. |
| 5,956,605 | A | 9/1999 | Akram et al. |
| 5,985,739 | A | 11/1999 | Plettner et al. |
| 5,998,808 | A | 12/1999 | Matsushita |
| 6,008,126 | A | 12/1999 | Leedy |
| 6,049,124 | A | 4/2000 | Raiser et al. |
| 6,080,640 | A | 6/2000 | Gardner et al. |
| 6,121,688 | A | 9/2000 | Akagawa |
| 6,265,775 | B1 | 7/2001 | Seyyedy |
| 6,374,770 | B1 | 4/2002 | Lee |
| 6,410,983 | B1 | 6/2002 | Moriizumi et al. |
| 6,423,640 | B1 | 7/2002 | Lee et al. |
| 6,465,892 | B1 | 10/2002 | Suga |
| 6,500,694 | B1 | 12/2002 | Enquist |
| 6,582,991 | B1 | 6/2003 | Maeda et al. |
| 6,686,588 | B1 | 2/2004 | Webster et al. |
| 6,713,857 | B1 | 3/2004 | Tsai |
| 6,768,208 | B2 | 7/2004 | Lin et al. |
| 6,782,610 | B1 | 8/2004 | Iijima et al. |
| 6,867,073 | B1 | 3/2005 | Enquist |
| 6,887,769 | B2 | 5/2005 | Kellar et al. |
| 6,908,027 | B2 | 6/2005 | Tolchinsky et al. |
| 6,962,835 | B2 | 11/2005 | Tong et al. |
| 7,045,453 | B2 | 5/2006 | Canaperi et al. |
| 7,078,811 | B2 | 7/2006 | Suga |
| 7,105,980 | B2 | 9/2006 | Abbott et al. |
| 7,126,212 | B2 | 10/2006 | Enquist et al. |
| 7,193,423 | B1 | 3/2007 | Dalton et al. |
| 7,262,492 | B2 | 8/2007 | Pieda et al. |
| 7,319,197 | B2 | 1/2008 | Oggioni et al. |
| 7,354,798 | B2 | 4/2008 | Pogge et al. |
| 7,385,283 | B2 | 6/2008 | Wu et al. |
| 7,554,203 | B2 | 6/2009 | Zhou et al. |
| 7,566,634 | B2 | 7/2009 | Beyne et al. |
| 7,582,971 | B2 | 9/2009 | Kameyama et al. |
| 7,589,409 | B2 | 9/2009 | Gibson et al. |
| 7,663,231 | B2 | 2/2010 | Chang et al. |
| 7,750,488 | B2 | 7/2010 | Patti et al. |
| 7,759,751 | B2 | 7/2010 | Ono |
| 7,781,309 | B2 | 8/2010 | Morita et al. |
| 7,786,572 | B2 | 8/2010 | Chen |
| 7,790,578 | B2 | 9/2010 | Furui |
| 7,803,693 | B2 | 9/2010 | Trezza |
| 7,816,235 | B2 | 10/2010 | Chan et al. |
| 7,816,856 | B2 | 10/2010 | Cok et al. |
| 7,843,052 | B1 | 11/2010 | Yoo et al. |
| 7,897,481 | B2 | 3/2011 | Chiou et al. |
| 7,932,616 | B2 | 4/2011 | Meguro |
| 7,977,789 | B2 | 7/2011 | Park |
| 8,026,181 | B2 | 9/2011 | Arita et al. |
| 8,044,497 | B2 | 10/2011 | Cheah et al. |
| 8,049,303 | B2 | 11/2011 | Osaka et al. |
| 8,064,224 | B2 | 11/2011 | Mahajan et al. |
| 8,168,458 | B2 | 5/2012 | Do et al. |
| 8,178,963 | B2 | 5/2012 | Yang |
| 8,178,964 | B2 | 5/2012 | Yang |
| 8,183,127 | B2 | 5/2012 | Patti et al. |
| 8,193,632 | B2 | 6/2012 | Chang et al. |
| 8,227,904 | B2 | 7/2012 | Braunisch et al. |
| 8,241,961 | B2 | 8/2012 | Kim et al. |
| 8,263,434 | B2 | 9/2012 | Pagaila et al. |
| 8,314,007 | B2 | 11/2012 | Vaufredaz |
| 8,349,635 | B1 | 1/2013 | Gan et al. |
| 8,377,798 | B2 | 2/2013 | Peng et al. |
| 8,405,225 | B2 | 3/2013 | Yu et al. |
| 8,441,131 | B2 | 5/2013 | Ryan |
| 8,456,856 | B2 | 6/2013 | Lin et al. |
| 8,476,146 | B2 | 7/2013 | Chen et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,513,088 | B2 | 8/2013 | Yoshimura et al. |
| 8,519,514 | B2 | 8/2013 | Fujii |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,691,601 | B2 | 4/2014 | Izuha |
| 8,697,493 | B2 | 4/2014 | Sadaka |
| 8,716,105 | B2 | 5/2014 | Sadaka et al. |
| 8,791,575 | B2 | 7/2014 | Oganesian et al. |
| 8,802,538 | B1 | 8/2014 | Liu |
| 8,809,123 | B2 | 8/2014 | Liu et al. |
| 8,841,002 | B2 | 9/2014 | Tong |
| 8,878,353 | B2 | 11/2014 | Haba et al. |
| 8,901,748 | B2 | 12/2014 | Manusharow et al. |
| 8,912,670 | B2 | 12/2014 | Teh et al. |
| 8,963,335 | B2 | 2/2015 | Woychik et al. |
| 8,975,163 | B1 | 3/2015 | Lei et al. |
| 8,975,726 | B2 | 3/2015 | Chen et al. |
| 8,987,137 | B2 | 3/2015 | Bachman et al. |
| 8,988,299 | B2 | 3/2015 | Kam et al. |
| 9,006,908 | B2 | 4/2015 | Pincu et al. |
| 9,029,242 | B2 | 5/2015 | Holden et al. |
| 9,054,101 | B2 | 6/2015 | Semmelmeyer et al. |
| 9,059,010 | B2 | 6/2015 | Yoshida et al. |
| 9,076,860 | B1 | 7/2015 | Lei et al. |
| 9,076,929 | B2 | 7/2015 | Katsuno et al. |
| 9,093,350 | B2 | 7/2015 | Endo et al. |
| 9,126,236 | B2 | 9/2015 | Roos et al. |
| 9,136,293 | B2 | 9/2015 | Yee et al. |
| 9,142,517 | B2 | 9/2015 | Liu et al. |
| 9,153,552 | B2 | 10/2015 | Teh et al. |
| 9,159,690 | B2 | 10/2015 | Chiu |
| 9,171,756 | B2 | 10/2015 | Enquist et al. |
| 9,171,816 | B2 | 10/2015 | Teh et al. |
| 9,184,125 | B2 | 11/2015 | Enquist et al. |
| 9,190,380 | B2 | 11/2015 | Teh et al. |
| 9,224,697 | B1 | 12/2015 | Kwon et al. |
| 9,224,704 | B2 | 12/2015 | Landru |
| 9,230,941 | B2 | 1/2016 | Chen et al. |
| 9,252,172 | B2 | 2/2016 | Chow et al. |
| 9,257,399 | B2 | 2/2016 | Kuang et al. |
| 9,269,701 | B2 | 2/2016 | Starkston et al. |

(56) References Cited

U.S. PATENT DOCUMENTS

| | | |
|---|---|---|
| 9,275,971 B2 | 3/2016 | Chiu et al. |
| 9,299,736 B2 | 3/2016 | Chen et al. |
| 9,312,198 B2 | 4/2016 | Meyer et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,433 B2 | 5/2016 | Lee et al. |
| 9,349,703 B2 | 5/2016 | Chiu et al. |
| 9,355,997 B2 | 5/2016 | Katkar et al. |
| 9,368,866 B2 | 6/2016 | Yu |
| 9,373,527 B2 | 6/2016 | Yu et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,570,421 B2 | 2/2017 | Wu et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,653,433 B2 | 5/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,673,096 B2 | 6/2017 | Hirschler et al. |
| 9,674,939 B2 | 6/2017 | Scannell |
| 9,704,827 B2 | 7/2017 | Huang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,865,567 B1 | 1/2018 | Chaware et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,180 B2 | 4/2018 | Kim et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 | 5/2018 | Yu et al. |
| 9,972,611 B2 | 5/2018 | Pappu et al. |
| 9,991,231 B2 | 6/2018 | Woychik et al. |
| 10,002,844 B1 | 6/2018 | Wang et al. |
| 10,026,605 B2 | 7/2018 | Doub et al. |
| 10,032,722 B2 | 7/2018 | Yu et al. |
| 10,074,630 B2 | 9/2018 | Kelly et al. |
| 10,075,657 B2 | 9/2018 | Fahim et al. |
| 10,170,409 B2 | 1/2019 | Ganesan et al. |
| 10,204,893 B2 | 2/2019 | Uzoh et al. |
| 10,269,619 B2 | 4/2019 | Yu et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,333,623 B1 | 6/2019 | Liao et al. |
| 10,410,976 B2 | 9/2019 | Asano et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,504,824 B1 | 12/2019 | Pan et al. |
| 10,508,030 B2 | 12/2019 | Katkar et al. |
| 10,510,629 B2 | 12/2019 | Chen et al. |
| 10,522,499 B2 | 12/2019 | Enquist et al. |
| 10,529,637 B1 | 1/2020 | Yu et al. |
| 10,529,690 B2 | 1/2020 | Shih et al. |
| 10,529,693 B2 | 1/2020 | Agarwal et al. |
| 10,559,507 B1 | 2/2020 | Saketi et al. |
| 10,580,823 B2 | 3/2020 | Zhang et al. |
| 10,629,567 B2 | 4/2020 | Uzoh et al. |
| 10,636,767 B2 | 4/2020 | Haba |
| 10,672,674 B2 | 6/2020 | Yu et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,770,430 B1 | 9/2020 | Kim et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,872,852 B2 | 12/2020 | Shih |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,623 B2 | 10/2021 | Hsu et al. |
| 11,145,626 B2 | 10/2021 | Hwang et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,427 B2 | 6/2022 | Loo et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,538,781 B2 | 12/2022 | Haba |
| 11,558,029 B2 | 1/2023 | Ito |
| 11,631,647 B2 | 4/2023 | Haba |
| 11,652,083 B2 | 5/2023 | Uzoh et al. |

(56) References Cited

U.S. PATENT DOCUMENTS

| | | |
|---|---|---|
| 11,658,173 B2 | 5/2023 | Uzoh et al. |
| 11,728,273 B2 | 8/2023 | Haba |
| 11,764,177 B2 | 9/2023 | Haba |
| 11,764,189 B2 | 9/2023 | Gao et al. |
| 11,817,409 B2 | 11/2023 | Haba et al. |
| 11,837,582 B2 | 12/2023 | Gao et al. |
| 11,837,596 B2 | 12/2023 | Uzoh et al. |
| 11,916,054 B2 | 2/2024 | Enquist et al. |
| 11,916,076 B2 | 2/2024 | DeLaCruz et al. |
| 11,955,463 B2 | 4/2024 | Uzoh et al. |
| 12,046,482 B2 * | 7/2024 | Haba .......... H01L 23/3107 |
| 12,046,569 B2 | 7/2024 | Haba |
| 12,113,056 B2 | 10/2024 | Uzoh et al. |
| 12,266,640 B2 | 4/2025 | Gao et al. |
| 12,266,650 B2 | 4/2025 | Uzoh et al. |
| 12,272,677 B2 | 4/2025 | Uzoh et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0157407 A1 | 8/2004 | Tong et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0101130 A1 | 5/2005 | Lopatin et al. |
| 2005/0104196 A1 | 5/2005 | Kashiwazaki |
| 2005/0133930 A1 | 6/2005 | Savastisuk et al. |
| 2005/0153522 A1 | 7/2005 | Hwang et al. |
| 2005/0161808 A1 | 7/2005 | Anderson |
| 2005/0218518 A1 | 10/2005 | Jiang et al. |
| 2006/0057945 A1 | 3/2006 | Hsu et al. |
| 2006/0063312 A1 | 3/2006 | Kurita |
| 2006/0087042 A1 | 4/2006 | Kameyama et al. |
| 2006/0220256 A1 | 10/2006 | Shim et al. |
| 2006/0223216 A1 | 10/2006 | Chang et al. |
| 2006/0234473 A1 | 10/2006 | Wong et al. |
| 2006/0278331 A1 | 12/2006 | Dugas et al. |
| 2007/0007639 A1 | 1/2007 | Fukazawa et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0123061 A1 | 5/2007 | Evertsen et al. |
| 2007/0148912 A1 | 6/2007 | Morita et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0165521 A1 | 7/2008 | Bernstein et al. |
| 2008/0227238 A1 | 9/2008 | Ko et al. |
| 2008/0231311 A1 | 9/2008 | Condorelli et al. |
| 2008/0265421 A1 | 10/2008 | Brunnbauer et al. |
| 2008/0268614 A1 | 10/2008 | Yang et al. |
| 2008/0272477 A1 | 11/2008 | Do et al. |
| 2008/0308928 A1 | 12/2008 | Chang |
| 2008/0315372 A1 | 12/2008 | Kuan et al. |
| 2009/0029274 A1 | 1/2009 | Olson et al. |
| 2009/0068831 A1 | 3/2009 | Enquist et al. |
| 2009/0095399 A1 | 4/2009 | Zussy et al. |
| 2009/0149023 A1 | 6/2009 | Koyanagi |
| 2009/0206461 A1 | 8/2009 | Yoon |
| 2009/0227089 A1 | 9/2009 | Plaut et al. |
| 2009/0252939 A1 | 10/2009 | Park et al. |
| 2009/0273094 A1 | 11/2009 | Ha et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0112782 A1 | 5/2010 | Teixeira |
| 2010/0123268 A1 | 5/2010 | Menard |
| 2010/0129999 A1 | 5/2010 | Zingher et al. |
| 2010/0164083 A1 | 7/2010 | Yim |
| 2010/0167534 A1 | 7/2010 | Iwata |
| 2010/0213819 A1 | 8/2010 | Cok et al. |
| 2010/0258952 A1 | 10/2010 | Fjelstad |
| 2010/0259166 A1 | 10/2010 | Cok et al. |
| 2010/0315110 A1 | 12/2010 | Fenner et al. |
| 2010/0327424 A1 | 12/2010 | Braunisch et al. |
| 2011/0042814 A1 | 2/2011 | Okuyama |
| 2011/0049696 A1 | 3/2011 | Haba et al. |
| 2011/0074033 A1 | 3/2011 | Kaltalioglu et al. |
| 2011/0128399 A1 | 6/2011 | Fujii |
| 2011/0165707 A1 | 7/2011 | Lott et al. |
| 2011/0186977 A1 | 8/2011 | Chi et al. |
| 2011/0233702 A1 | 9/2011 | Takahashi et al. |
| 2011/0248397 A1 | 10/2011 | Coffy et al. |
| 2011/0278717 A1 | 11/2011 | Pagaila et al. |
| 2011/0278732 A1 | 11/2011 | Yu et al. |
| 2011/0290552 A1 | 12/2011 | Palmateer et al. |
| 2012/0003792 A1 | 1/2012 | Cheah et al. |
| 2012/0025396 A1 | 2/2012 | Liao et al. |
| 2012/0049344 A1 | 3/2012 | Pagaila et al. |
| 2012/0056314 A1 | 3/2012 | Pagaila et al. |
| 2012/0074585 A1 | 3/2012 | Koo et al. |
| 2012/0077314 A1 | 3/2012 | Park et al. |
| 2012/0119360 A1 | 5/2012 | Kim et al. |
| 2012/0187516 A1 | 7/2012 | Sato |
| 2012/0190187 A1 | 7/2012 | Yang et al. |
| 2012/0194719 A1 | 8/2012 | Churchwell et al. |
| 2012/0199930 A1 | 8/2012 | Hayashi |
| 2012/0199960 A1 | 8/2012 | Cosue et al. |
| 2012/0212384 A1 | 8/2012 | Kam et al. |
| 2012/0217644 A1 | 8/2012 | Pagaila |
| 2012/0228762 A1 | 9/2012 | Fukuda et al. |
| 2012/0238070 A1 | 9/2012 | Libbert et al. |
| 2013/0001798 A1 | 1/2013 | Choi |
| 2013/0009325 A1 | 1/2013 | Mori |
| 2013/0037936 A1 | 2/2013 | Choi et al. |
| 2013/0037962 A1 | 2/2013 | Xue |
| 2013/0069239 A1 | 3/2013 | Kim et al. |
| 2013/0075923 A1 | 3/2013 | Park et al. |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0187292 A1 | 7/2013 | Semmelmeyer et al. |
| 2013/0214427 A1 | 8/2013 | Nakanoya |
| 2013/0234320 A1 | 9/2013 | Lu et al. |
| 2013/0264684 A1 | 10/2013 | Yu et al. |
| 2013/0265733 A1 | 10/2013 | Herbsommer et al. |
| 2013/0277855 A1 | 10/2013 | Kang et al. |
| 2013/0299997 A1 | 11/2013 | Sadaka |
| 2013/0334697 A1 | 12/2013 | Shin et al. |
| 2014/0008789 A1 | 1/2014 | Cho |
| 2014/0013606 A1 | 1/2014 | Nah et al. |
| 2014/0071652 A1 | 3/2014 | McShane et al. |
| 2014/0097536 A1 | 4/2014 | Schunk |
| 2014/0124818 A1 | 5/2014 | Hwang et al. |
| 2014/0154839 A1 | 6/2014 | Ahn et al. |
| 2014/0175655 A1 | 6/2014 | Chen et al. |
| 2014/0187040 A1 | 7/2014 | Enquist et al. |
| 2014/0217604 A1 | 8/2014 | Chou et al. |
| 2014/0225795 A1 | 8/2014 | Yu |
| 2014/0263959 A1 | 9/2014 | Hsu et al. |
| 2014/0264836 A1 | 9/2014 | Chun et al. |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0048503 A1 | 2/2015 | Chiu et al. |
| 2015/0064498 A1 | 3/2015 | Tong |
| 2015/0097022 A1 | 4/2015 | Di Cioccio et al. |
| 2015/0102468 A1 | 4/2015 | Kang et al. |
| 2015/0113195 A1 | 4/2015 | Kim |
| 2015/0130030 A1 | 5/2015 | Ma et al. |
| 2015/0130082 A1 | 5/2015 | Lu et al. |
| 2015/0145094 A1 | 5/2015 | Liu et al. |
| 2015/0145140 A1 | 5/2015 | Haba et al. |

(56) References Cited

U.S. PATENT DOCUMENTS

| | | |
|---|---|---|
| 2015/0162294 A1 | 6/2015 | Kawasaki |
| 2015/0171050 A1 | 6/2015 | Chen et al. |
| 2015/0171063 A1 | 6/2015 | Zhai et al. |
| 2015/0179481 A1 | 6/2015 | Lin |
| 2015/0179605 A1 | 6/2015 | Dubey et al. |
| 2015/0194406 A1 | 7/2015 | Teh et al. |
| 2015/0200153 A1 | 7/2015 | Wang et al. |
| 2015/0200182 A1 | 7/2015 | Wang et al. |
| 2015/0206865 A1 | 7/2015 | Yu et al. |
| 2015/0235949 A1 | 8/2015 | Yu et al. |
| 2015/0235991 A1 | 8/2015 | Gu et al. |
| 2015/0262845 A1 | 9/2015 | Hwang et al. |
| 2015/0270209 A1 | 9/2015 | Woychik et al. |
| 2015/0287672 A1 | 10/2015 | Yazdani |
| 2015/0287697 A1 | 10/2015 | Tsai et al. |
| 2015/0303174 A1 | 10/2015 | Yu et al. |
| 2015/0325557 A1 | 11/2015 | Yiu et al. |
| 2015/0340285 A1 | 11/2015 | Enquist et al. |
| 2015/0371951 A1 | 12/2015 | Yeh et al. |
| 2016/0020235 A1 | 1/2016 | Yamashita |
| 2016/0035687 A1 | 2/2016 | Lin et al. |
| 2016/0071770 A1 | 3/2016 | Albermann et al. |
| 2016/0093592 A1 | 3/2016 | Zhai |
| 2016/0126634 A1 | 5/2016 | Liu et al. |
| 2016/0141267 A1 | 5/2016 | Hagimoto et al. |
| 2016/0141280 A1 | 5/2016 | Lin et al. |
| 2016/0155724 A1 | 6/2016 | Kim et al. |
| 2016/0163650 A1 | 6/2016 | Gao et al. |
| 2016/0190103 A1 | 6/2016 | Kabe et al. |
| 2016/0218082 A1 | 7/2016 | Lee et al. |
| 2016/0233175 A1 | 8/2016 | Dubey et al. |
| 2016/0233196 A1 | 8/2016 | Kim et al. |
| 2016/0254249 A1 | 9/2016 | Jeng et al. |
| 2016/0254299 A1 | 9/2016 | Gomi |
| 2016/0260684 A1 | 9/2016 | Zhai et al. |
| 2016/0276296 A1 | 9/2016 | Woychik et al. |
| 2016/0300813 A1 | 10/2016 | Zhai et al. |
| 2016/0300817 A1 | 10/2016 | Do et al. |
| 2016/0315071 A1 | 10/2016 | Zhai et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0343695 A1 | 11/2016 | Lin et al. |
| 2016/0351499 A1 | 12/2016 | Kitada |
| 2016/0358865 A1 | 12/2016 | Shih et al. |
| 2016/0358891 A1 | 12/2016 | Geissler et al. |
| 2016/0372323 A1 | 12/2016 | Doub et al. |
| 2017/0023405 A1 | 1/2017 | Fahim et al. |
| 2017/0062383 A1 | 3/2017 | Yee et al. |
| 2017/0084576 A1 | 3/2017 | Yu et al. |
| 2017/0092680 A1 | 3/2017 | Kwon |
| 2017/0179078 A1 | 4/2017 | Yu et al. |
| 2017/0125379 A1 | 5/2017 | Chen et al. |
| 2017/0141040 A1 | 5/2017 | Yu et al. |
| 2017/0148764 A1 | 5/2017 | Wang et al. |
| 2017/0148777 A1 | 5/2017 | Bono et al. |
| 2017/0186799 A1 | 6/2017 | Lin et al. |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1 | 7/2017 | Kao et al. |
| 2017/0207158 A1 | 7/2017 | Kang et al. |
| 2017/0243845 A1 | 8/2017 | Lee et al. |
| 2017/0250160 A1 | 8/2017 | Wu et al. |
| 2017/0250161 A1 | 8/2017 | Haba |
| 2017/0263518 A1 | 9/2017 | Yu et al. |
| 2017/0263595 A1 | 9/2017 | Kurita et al. |
| 2017/0284951 A1 | 10/2017 | Pindl et al. |
| 2017/0287874 A1 | 10/2017 | Fang et al. |
| 2017/0294422 A1 | 10/2017 | Solimando et al. |
| 2017/0330855 A1 | 11/2017 | Tung et al. |
| 2017/0345761 A1 | 11/2017 | Yu et al. |
| 2017/0358533 A1 | 12/2017 | Briggs et al. |
| 2017/0358553 A1 | 12/2017 | Kim et al. |
| 2017/0365580 A1 | 12/2017 | Shih et al. |
| 2017/0365582 A1 | 12/2017 | Seo et al. |
| 2017/0365591 A1 | 12/2017 | Chang et al. |
| 2018/0005984 A1 | 1/2018 | Yu et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0026008 A1 | 1/2018 | Jeng et al. |
| 2018/0053746 A1 | 2/2018 | Yu et al. |
| 2018/0061741 A1 | 3/2018 | Beyne |
| 2018/0068958 A1 | 3/2018 | Cho et al. |
| 2018/0068978 A1 | 3/2018 | Jeng et al. |
| 2018/0096931 A1 | 4/2018 | Huang et al. |
| 2018/0096988 A1 | 4/2018 | Long et al. |
| 2018/0122774 A1 | 5/2018 | Huang et al. |
| 2018/0130691 A1 | 5/2018 | Uzoh |
| 2018/0130769 A1 | 5/2018 | Tan et al. |
| 2018/0130772 A1 | 5/2018 | Yu et al. |
| 2018/0138101 A1 | 5/2018 | Yu et al. |
| 2018/0151477 A1 | 5/2018 | Yu et al. |
| 2018/0158749 A1 | 6/2018 | Yu et al. |
| 2018/0175008 A1 | 6/2018 | Fong et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0269143 A1 | 9/2018 | Adams et al. |
| 2018/0273377 A1 | 9/2018 | Katkar et al. |
| 2018/0286805 A1 | 10/2018 | Huang et al. |
| 2018/0294212 A1 | 10/2018 | Chen et al. |
| 2018/0301443 A1 | 10/2018 | Kim et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1 | 11/2018 | Yu et al. |
| 2018/0366436 A1 | 12/2018 | Wang et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0006263 A1 | 1/2019 | Yu et al. |
| 2019/0029119 A1 | 1/2019 | Weber |
| 2019/0043792 A1 | 2/2019 | Weerasekera et al. |
| 2019/0043910 A1 | 2/2019 | Miyazawa et al. |
| 2019/0043914 A1 | 2/2019 | von Känel |
| 2019/0067247 A1 | 2/2019 | Yoo et al. |
| 2019/0088621 A1 | 3/2019 | Yang et al. |
| 2019/0096741 A1 | 3/2019 | Uzoh et al. |
| 2019/0096825 A1 | 3/2019 | Kim et al. |
| 2019/0096842 A1 | 3/2019 | Fountain, Jr. et al. |
| 2019/0103409 A1 | 4/2019 | Xu et al. |
| 2019/0103425 A1 | 4/2019 | Yoon et al. |
| 2019/0109119 A1 | 4/2019 | Shih et al. |
| 2019/0115277 A1 | 4/2019 | Yu et al. |
| 2019/0123006 A1 | 4/2019 | Chen et al. |
| 2019/0131277 A1 | 5/2019 | Yang et al. |
| 2019/0157333 A1 | 5/2019 | Tsai |
| 2019/0189590 A1 | 6/2019 | Agarwal et al. |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0214423 A1 | 7/2019 | Kim et al. |
| 2019/0221548 A1 | 7/2019 | Huang et al. |
| 2019/0237374 A1 | 8/2019 | Huang et al. |
| 2019/0265411 A1 | 8/2019 | Huang et al. |
| 2019/0267334 A1 | 8/2019 | Bowers |
| 2019/0319007 A1 | 10/2019 | Uzoh et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0341332 A1 | 11/2019 | Lin et al. |
| 2019/0341350 A1 | 11/2019 | Huang et al. |
| 2019/0348336 A1 | 11/2019 | Katkar et al. |
| 2019/0355637 A1 | 11/2019 | Chen et al. |

(56) References Cited

U.S. PATENT DOCUMENTS

| | | |
|---|---|---|
| 2019/0355706 A1 | 11/2019 | Enquist et al. |
| 2019/0371763 A1 | 12/2019 | Agarwal et al. |
| 2019/0372000 A1 | 12/2019 | Yu et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006173 A1 | 1/2020 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1 | 1/2020 | Fountain, Jr. et al. |
| 2020/0035560 A1 | 1/2020 | Block et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0091217 A1 | 3/2020 | Horikoshi et al. |
| 2020/0098736 A1 | 3/2020 | Liao et al. |
| 2020/0106156 A1 | 4/2020 | Lu et al. |
| 2020/0126906 A1 | 4/2020 | Uzoh et al. |
| 2020/0135684 A1 | 4/2020 | Kim et al. |
| 2020/0161263 A1 | 5/2020 | Chen et al. |
| 2020/0176419 A1 | 6/2020 | Dabral et al. |
| 2020/0185367 A1 | 6/2020 | Bhagavat et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0303311 A1 | 9/2020 | Young et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0028145 A1 | 1/2021 | Yu et al. |
| 2021/0057309 A1 | 2/2021 | Hu et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0104487 A1 | 4/2021 | Uzoh et al. |
| 2021/0111125 A1 | 4/2021 | Chen et al. |
| 2021/0118832 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1 | 7/2021 | Wu et al. |
| 2021/0225708 A1 | 7/2021 | Lee et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0375827 A1 | 12/2021 | Chen et al. |
| 2021/0384133 A1 | 12/2021 | Ong et al. |
| 2021/0384135 A1 | 12/2021 | Kuan et al. |
| 2021/0384158 A1 | 12/2021 | Chung et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0391301 A1 | 12/2021 | Tomishima et al. |
| 2021/0407941 A1 | 12/2021 | Haba |
| 2022/0005787 A1 | 1/2022 | Han et al. |
| 2022/0020729 A1 | 1/2022 | Gao et al. |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0375864 A1 | 11/2022 | Wang et al. |
| 2022/0399294 A1 | 12/2022 | Dogiamis et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0282610 A1 | 9/2023 | Uzoh et al. |
| 2023/0282634 A1 | 9/2023 | Enquist et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420399 A1 | 12/2023 | Haba et al. |
| 2024/0006377 A1 | 1/2024 | Wang et al. |
| 2024/0038702 A1 | 2/2024 | Uzoh |

(56) References Cited

U.S. PATENT DOCUMENTS

| | | |
|---|---|---|
| 2024/0055407 A1 | 2/2024 | Workman et al. |
| 2024/0079376 A1 | 3/2024 | Suwito et al. |
| 2024/0088120 A1 | 3/2024 | Enquist et al. |
| 2024/0105674 A1 | 3/2024 | Uzoh et al. |
| 2024/0145458 A1 | 5/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203948 A1 | 6/2024 | Uzoh et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0243103 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332248 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0112123 A1 | 4/2025 | Katkar et al. |
| 2025/0149483 A1 | 5/2025 | Haba |

FOREIGN PATENT DOCUMENTS

| | | |
|---|---|---|
| CN | 105810649 A | 7/2016 |
| CN | 107527885 | 12/2017 |
| CN | 112687701 A | 4/2021 |
| EP | 1011133 A1 | 6/2000 |
| EP | 2 339 614 A1 | 6/2011 |
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2007-294724 A | 11/2007 |
| JP | 2008-130603 A | 6/2008 |
| JP | 2009-135348 | 6/2009 |
| JP | 2009-212315 A | 9/2009 |
| JP | 2010-034294 A | 2/2010 |
| JP | 2010-073964 | 4/2010 |
| JP | 2011001412 A | 1/2011 |
| JP | 2011-171614 | 9/2011 |
| JP | 2012191062 A | 10/2012 |
| JP | 2013-33786 | 2/2013 |
| JP | 2013168577 A | 8/2013 |
| JP | 2017-130610 | 7/2017 |
| JP | 2018-160519 | 10/2018 |
| KR | 10-2001-0104643 | 11/2001 |
| KR | 10-2004-0020827 | 3/2004 |
| KR | 10-2010-0123755 | 11/2010 |
| KR | 10-2015-0097798 | 8/2015 |
| KR | 10-2018-0054419 | 5/2018 |
| KR | 101901711 B1 | 9/2018 |
| KR | 10-2020-0060670 | 6/2020 |
| KR | 10-2020-0092236 | 8/2020 |
| TW | I464810 B | 12/2014 |
| WO | WO 2005/043584 A2 | 5/2005 |
| WO | WO 2006/100444 A1 | 9/2006 |
| WO | WO 2008/112101 A2 | 9/2008 |
| WO | WO 2009/005898 A1 | 1/2009 |
| WO | WO 2010/024678 A1 | 3/2010 |
| WO | WO 2012/004964 A1 | 1/2012 |
| WO | WO 2014/052445 A1 | 4/2014 |
| WO | WO 2015/134227 A1 | 9/2015 |
| WO | WO 2017/034654 A1 | 3/2017 |
| WO | WO 2017/052652 A1 | 3/2017 |
| WO | WO 2017/151442 A1 | 9/2017 |
| WO | WO 2019/054364 A1 | 3/2019 |

OTHER PUBLICATIONS

"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.

"The effects of edge trimming—Engineering R&D Division, Operation V," DISCO Technical Review Mar. 2016, 3 pages.

Amirfeiz et al., "Formation of silicon structures by plasma-activated wafer bonding," Journal of The Electrochemical Society, 2000, vol. 147, No. 7, pp. 2693-2698.

Braunisch, H. et al., "High-speed performance of silicon bridge die-to-die interconnects," 2011 IEEE, pp. 95-98.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Ceramic Microstructures: Control at the Atomic Level, Recent Progress in Surface Activated Bonding, 1998, pp. 385-389.

Chang, T.C. et al., "A method for fabricating a superior oxide/nitride/oxide gate stack," Electrochemical and Solid-State Letters, 2004, vol. 7, No. 7, pp. G138-G140.

Chung et al., "Room temperature GaAs—Si and InP—Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Frumusanu, Andrei, "TSMC's version of EMIB is 'LSI': Currently in pre-qualification," AnandTech, https://www.anandtech.com/show/16031/tsmcs-version-of-emib-lsi-3dfabric, Aug. 25, 2020, 6 pages.

Fukushima, T. et al., "New three-dimensional integration technology using self-assembly technique," International Electron Devices Meeting Dec. 5-7, 2005, IEEE, Dec. 5, 2005, pp. 348-351.

Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.

Gösele et al., "Semiconductor Wafer Bonding: A flexible approach to materials combinations in microelectronics; micromechanics and optoelectronics," IEEE, 1997, pp. 23-32.

Hooper, A. et al. "Review of wafer dicing techniques for via-middle process 3DI/TSV ultrathin silicon device wafers," 2015 IEEE 65th Electronic Components and Technology Conference (ECTC).

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.

(56) References Cited

OTHER PUBLICATIONS

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Jin et al., "Silicon/Silicon Oxide/LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, Mar. 2006; 3 pages.

Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.

Khan et al., "Technologies for printing sensors and electronics over large flexible substrates," IEEE Sensors Journal, Jun. 2015, vol. 15, No. 6, pp. 3164-3185.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—Cu, Cu—Si, and Cu—SiO2 at low temperature," Proceedings—Electrochemical Society, 2003, vol. 19, pp. 239-247.

Lei, W.S. et al., "Die singulation technologies for advanced packaging: A critical review," J. Vac. Sci. Technol. B 30(4), Apr. 6, 2012, Jul./Aug. 1012, pp. 040801-1-040801-27.

Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.

Matsuzawa et al., "Room-temperature interconnection of electroplated Au microbump by means of surface activated bonding method," Electronic Components and Technology Conference, 2001, 51st Proceedings, IEEE, pp. 384-387.

Michailos, Jean, "Future landscape for 3D Integration: from Interposers to 3D High Density," 3d ASIP—Dec. 13-15, 2016, San Francisco Airport, USA, 46 pages.

Moriceau, H. et al., "Overview of recent direct wafer bonding advances and applications," Adv Nat Sciences: Nanoscience and Nanotechnology, Dec. 2010;1(4):043004; 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, 99. 237-244.

NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, Final Summary Jul. 2010; 1 page.

Oberhammer, J. et al., "Sealing of adhesive bonded devices on wafer level," Sensors and Actuators A, 2004, vol. 110, No. 1-3, pp. 407-412.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."

Plössl, A. et al., "Wafer direct bonding: tailoring adhesion between brittle materials," Materials Science and Engineering: R: Reports. Mar. 10, 1999;25(1-2):1-88.

Reiche et al., "The effect of a plasma pretreatment on the Si/Si bonding behaviour," Electrochemical Society Proceedings, 1998, vol. 97-36, pp. 437-444.

Roberds et al., "Low temperature , in situ, plasma activated wafer bonding," Electrochemical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Conference, 51st Proceedings, 2001, IEEE, pp. 755-760.

Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech lnsights article dated Apr. 24, 2016), describing and showing a similar sensor product within the Samsung Galaxy S7; however the imaged part and the part shown in the Morrison et al. article share the part name "Sony IMX260 image." (8 pages).

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

(56) References Cited

OTHER PUBLICATIONS

Suga, "UHV room temperature joining by the surface activated bonding method," Advances in science and technology, Techna, Faenza, Italie, 1999, pp. C1079-C1089.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Swaminathan, P., "Lecture 29: Productivity and process yield," National Programme on Technology Enhanced Learning (NPTEL), MM5017: Electronic materials, devices, and fabrication, (2016); 16 pages.

Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room temperature silicon wafer direct bonding in vacuum by Ar beam irradiation," Micro Electro Mechanical Systems, MEMS '97 Proceedings, 1997, IEEE, pp. 191-196.

Takagi et al., "Room-temperature bonding of lithium niobate and silicon wafers by argon-beam surface activation," Appl. Phys. Lett., 1999. vol. 74, pp. 2387.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

\* cited by examiner

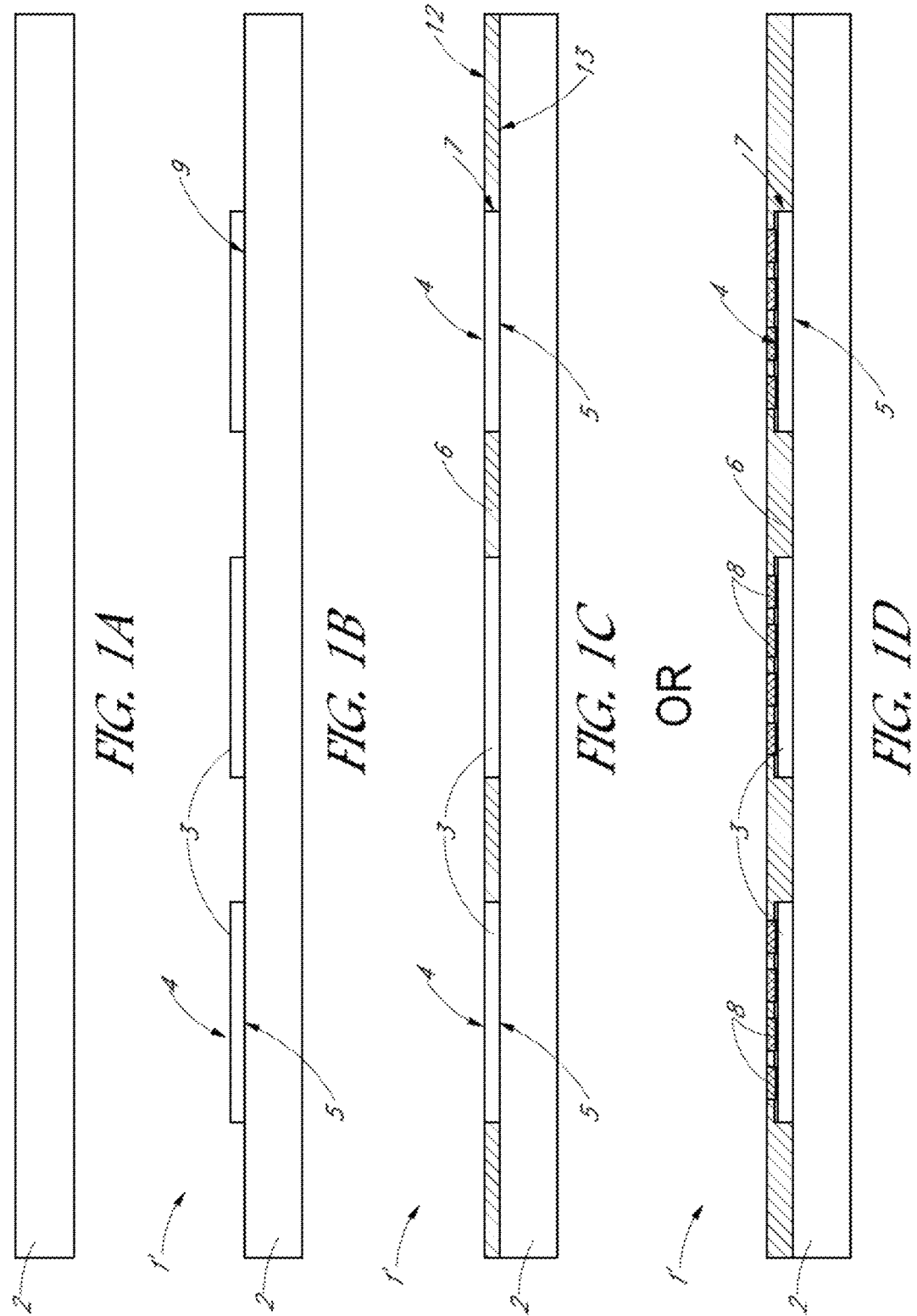

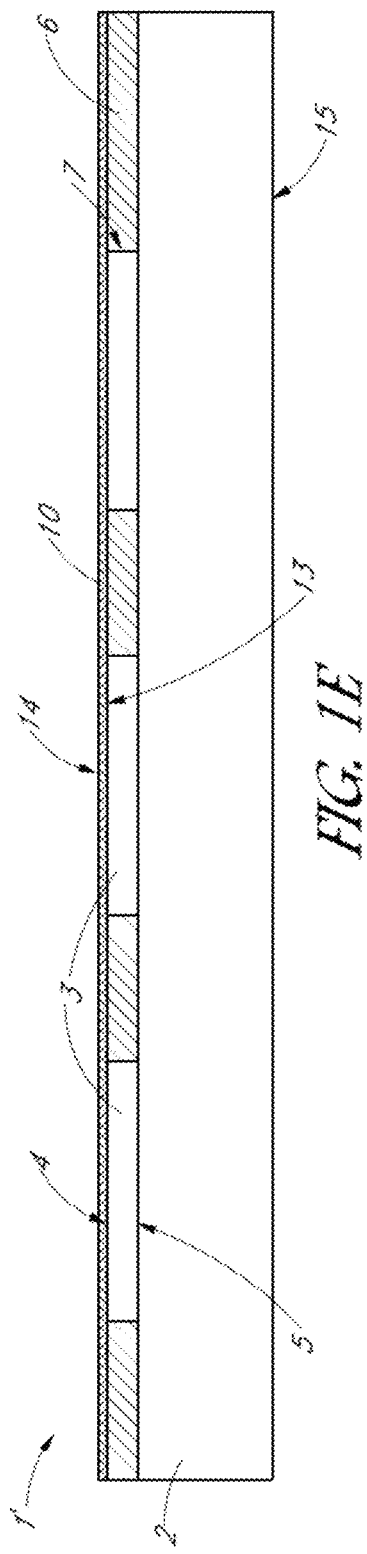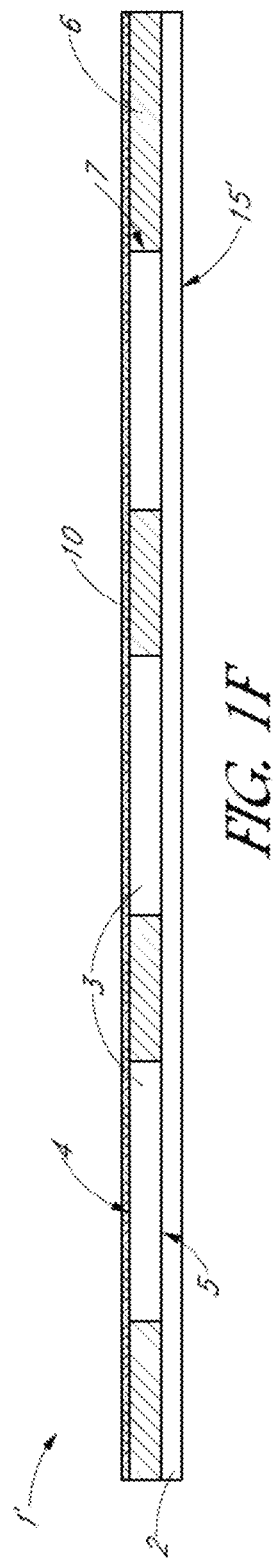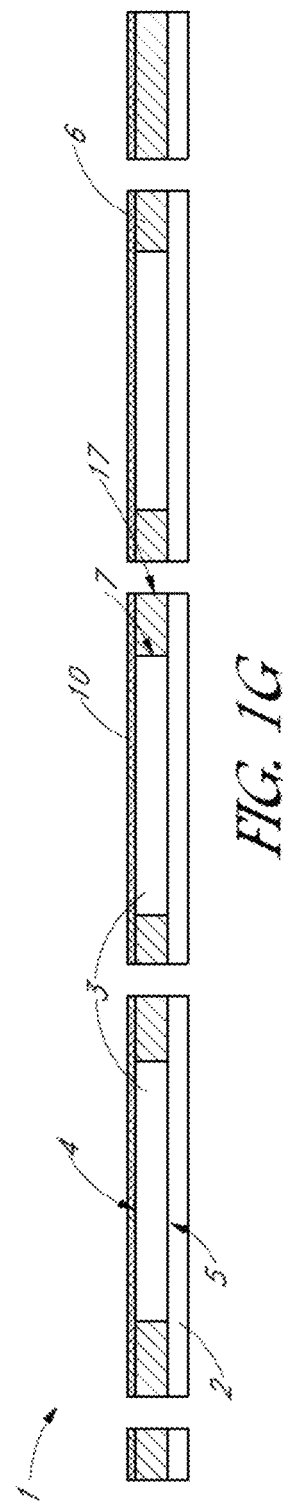

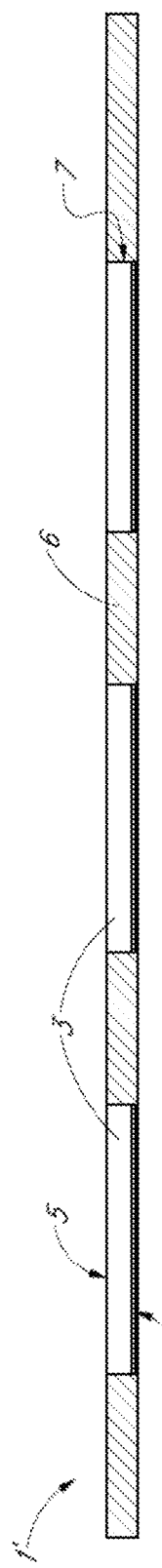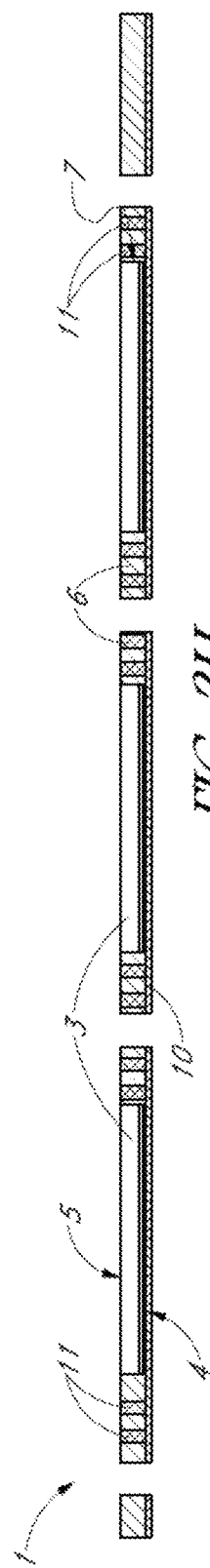

MICROELECTRONIC ASSEMBLIES

CROSS-REFERENCE TO RELATED APPLICATIONS

This application is a continuation of U.S. patent application Ser. No. 17/937,593, filed Oct. 3, 2022, which is a continuation of U.S. patent application Ser. No. 16/503,021, filed Jul. 3, 2019, which claims priority to U.S. Provisional Patent Application No. 62/694,543, filed on Jul. 6, 2018, the entire contents of which are incorporated by reference herein in their entirety and for all purposes.

BACKGROUND

Field of the Invention

The field relates to microelectronic assemblies and, in particular, to microelectronic assemblies comprising packages (e.g., fanout or fan-in packages) that include one or more components that are directly bonded to one another without an intervening adhesive.

Description of the Related Art

In various packaging arrangements, singulated integrated device dies can be adhered with an adhesive onto a carrier such as tape or film. The singulated integrated device dies can be overmolded with a molding compound, forming what is sometimes referred to as a reconstituted wafer for further processing. Relatively fine-pitched electrical contacts of the one or more integrated device dies can be fanned out over the mold by a redistribution layer (RDL) to connect to relatively coarse-pitched electrodes or leads of another structure, such as a system substrate or motherboard. The dies can then be singulated from the reconstituted wafer, along with some of the side molding and overlying RDL. However, there remains a continuing need for improved packages and techniques for forming such packages.

BRIEF DESCRIPTION OF THE DRAWINGS

These aspects and others will be apparent from the following description of preferred embodiments and the accompanying drawing, which is meant to illustrate and not to limit the invention, wherein:

FIG. 1A is a schematic side view of a carrier, according to various embodiments.

FIG. 1B is a schematic side view of a partially-formed microelectronic assembly including a plurality of elements directly bonded to the carrier without an intervening adhesive.

FIG. 1C is a schematic side view of a partially-formed microelectronic assembly in which a molding compound is applied around and between adjacent elements.

FIG. 1D is a schematic side view of a partially-formed microelectronic assembly in which a molding compound is applied around and between adjacent elements, and between adjacent interconnections on front surfaces of the elements.

FIG. 1E is a schematic side view of a partially-formed microelectronic assembly in which a redistribution layer (RDL) is applied over an upper surface of the molding compound and over front surfaces of the elements.

FIG. 1F is a schematic side view of a partially-formed microelectronic assembly after at least a portion of the carrier has been removed.

FIG. 1G is a schematic side view of a plurality of microelectronic assemblies after singulation.

FIG. 2E is a schematic side view of the partially-formed microelectronic assembly of FIG. 2D, after at least a portion of the carrier has been removed.

FIG. 2F is a schematic side view of the partially-formed microelectronic assembly that includes a redistribution layer (RDL) over front surfaces of the elements.

FIG. 2G is a schematic side view showing a plurality of singulated microelectronic assemblies, according to various embodiments.

FIG. 2H is a schematic side view of a plurality of microelectronic assemblies including a plurality of through-mold vias.

DETAILED DESCRIPTION

Figure 1H:
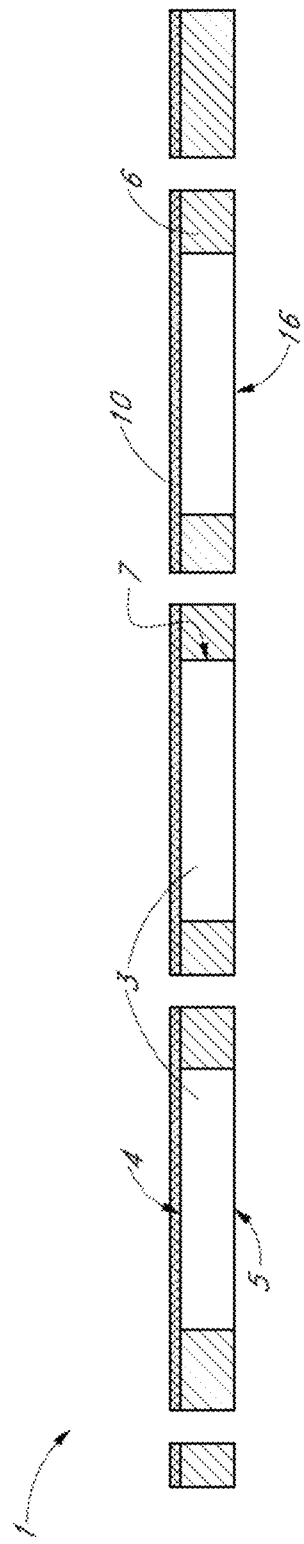
FIG. 1H is a schematic side view of a plurality of microelectronic assemblies in which the carrier has been completely removed from the elements.

Elements, including semiconductor elements such as integrated device dies (or "dies") or wafers, may be stacked in a three-dimensional (3D) arrangement, arranged laterally relative to one another in a side-by-side arrangement, or otherwise packaged to connect to an external system as part of various microelectronic packaging schemes. This can include stacking a layer of one or more elements (e.g., one or more dies, devices, and/or wafers) on a larger carrier, such as a larger base die, device, or wafer, stacking multiple dies or wafers in a vertical or horizontal arrangement, and various combinations thereof. The elements can be provided with one or more redistribution layers (RDL). The RDL can provide greater spacing between pads than the pads on the dies, thus facilitating connections with other electronic components.

For instance, one or more elements (e.g., integrated device dies) may be stacked onto a carrier (e.g., wafer, substrate, etc.) to form a packaging arrangement to facilitate interconnecting the dies with other circuits, boards, packages, and so forth. The dies may be formed with finely-pitched and finely-spaced conductive interconnections (e.g., less than about 5 microns, for example, about 1 micron, etc.)

that may be densely arranged and exposed on a surface of the dies. These finely-spaced interconnections may be intended to be electrically coupled to similarly finely-spaced interconnections of a redistribution layer (RDL), which are electrically continuous with a coarser set of interconnections (fanout) of the RDL, suitable for interconnection with the other circuits, boards, packages, and so forth. In many cases, the RDL may be formed as one or more metallization layers using a lithographic process, or the like. In some embodiments that include fanout packages, electrical contacts of the RDL can be coarser than contacts on the element (e.g., die) and can extend outside the footprint of the element (e.g., die). In other embodiments, the package can comprise a fan-in package, in which electrical contacts of the RDL may be disposed within the footprint of the element (e.g., die).

One method of providing RDL involves wafer-level packaging in which dies (e.g., integrated circuits) are singulated from wafer in which they are formed and then attached to the carrier using an adhesive or the like. An overmold may be applied to at least partially cover the carrier between the dies (and in some cases cover all or a portion of the exposed surfaces of the dies), to form a reconstituted substrate (which can comprise a reconstituted wafer or panel) that may be subjected to additional processing, such as the formation of RDL layer(s) for fanning out electrical connections. By spreading out over the adjacent molding, the RDL pads can be made bigger and/or with greater spacing than the pads on the dies. However, in some cases, the dies may shift position on the carrier during the overmolding process. In those cases, the adhesive may not hold the dies firmly in their placed positions when the overmold is applied. Even a small shift of the dies can result in the lithographic mask for the fanout metallization layer not matching or aligning with the fine pitch interconnects on the die. In some cases, the pitch of the die interconnects can be increased to account for the shift of the dies, however this can restrict the pitch (and the footprint of the die) to a size that is larger than desirable for many applications. Moreover, in some arrangements, the element or die tends to get pressed into the relatively soft adhesive. When the adhesive and carrier are removed (for example, by ultraviolet release), there may be a small step between the element (e.g., die) and the molding compound because the adhesive (now released) is higher than the die. Such a step creates issues for RDL formed over the previously covered surface, as the RDL dielectric must be thick enough to overcome the step and form reliable connections, which in turn creates high aspect ratio vias to be filled.

In an embodiment disclosed herein, the dies may be bonded to the carrier using various direct bonding techniques, including direct dielectric bonding, non-adhesive techniques, such as ZiBond® or a hybrid bonding technique, such as DBI®, both commercially available from Invensas Bonding Technologies, Inc. (formerly Ziptronix, Inc.), a subsidiary of Xperi Corp. The bonding includes a spontaneous process that takes place at ambient conditions when two prepared surfaces (such as the bonding surface of the dies and a prepared surface of the carrier) are brought together (see, for example, U.S. Pat. Nos. 6,864,585 and 7,485,968, which are incorporated by reference herein in their entirety). In some examples, respective mating surfaces of the bonded dies and the carrier can include the finely-spaced conductive interconnect structures of the dies, when the dies are bonded in a "face down" arrangement, for instance.

When bonding the dies to the carrier using a direct bonding or hybrid bonding technique, it is desirable that the surfaces of the dies to be bonded and the surface of the carrier be extremely flat and smooth. For instance, in general, the surfaces should have a very low variance in surface topology (i.e., nanometer scale variance, for example below 2 nm and preferably below 0.5 nm), so that the surfaces can be closely mated to form a lasting bond. Various conventional processes, such as chemical mechanical polishing (CMP) may be used to achieve the low surface roughness. It is also usually desirable that the surfaces be clean and have a low level of impurities, particles, or other residue that are large enough in size to cause bonding voids that can cause electrical continuity failures or other bonding defects.

In various embodiments disclosed herein, bonding the dies to the carrier using a direct bonding technique at ambient conditions and without an intervening adhesive (such as ZiBond® or DBI®, for example) allows the dies to be locked into position on the carrier and remain coplanar with one another. In this locked condition, the dies are not able to shift position during overmolding, or during any other process steps. Consequently, the lithographic mask for the fanout metallization layer has a high probability of matching and aligning with the fine pitch interconnects on the die, which can be formed to have as fine a pitch as desired for the intended application.

In various implementations, the dies can be processed while bonded to the carrier. For example, the processing can include the overmolding, the addition of the metallic fanout layer (e.g., RDL), and singulation with or without removal of the carrier. In some implementations, holes or openings (e.g., cavities) may be formed in the molding, which can be filled with metallic or other conductive materials to form through vias, contact pads, and so forth.

After processing, the carrier may be thinned, etched, or grinded away. In an implementation, the removal of the carrier can reveal metallic interconnects on the exposed die surface for RDL use (when the dies are bonded "face down," for example). An additional routing layer can be added to the revealed metallic interconnects if desired. Added vias may also be revealed at the exposed surface of the die or the molding, with the removal of the carrier. In some implementations, a portion of the carrier may be allowed to remain bonded to the dies, to act as a heat sink, a handle, or a structural support. The dies may be separated by singulation, at the molded area outside the periphery of the dies, before or after removal of the carrier, to form the package arrangements desired.

FIGS. 1A-1I illustrate a face-up method for forming a microelectronic assembly 1, according to various embodiments. FIG. 1A is a schematic side view of a carrier 2, according to various embodiments. The carrier 2 can comprise any suitable support structure on which the dies can be directly bonded, such as an integrated device die, an interposer, a package substrate, an electronic device, an optical device, a wafer, a glass substrate, a silicon on insulator (SOI) substrate, etc. The use of silicon, glass, or other semiconductor material for the carrier 2 can advantageously enable the carrier 2 to be polished to a very low surface roughness for directly bonded to other elements, such as integrated device dies. In other embodiments, however, the carrier 2 can comprise substrates of other materials (e.g., a ceramic substrate, a polymer substrate, or any other suitable substrate) on which a direct bonding layer of suitable material can be formed and polished. In some embodiments, the carrier 2 can comprise active electronic circuitry. In other embodiments, the carrier 2 may not include active circuitry.

FIG. 1B is a schematic side view of a partially-formed microelectronic assembly 1 including a plurality of elements 3 directly bonded to the carrier 2 without an intervening adhesive. The elements 3, can comprise, for example, thinned integrated device dies. The elements 3 can comprise any suitable type of element, such as an integrated device die, an optical device, etc. The element 3 can comprise a microelectronic substrate having one or more active devices formed therein or thereon. For example, each of the elements 3 can comprise a processor die, a memory die, a microelectromechanical systems (MEMS) die, a passive component, an optical device, or any other suitable type of device die. Circuitry (such as active components like transistors) can be patterned at or near active surfaces of the elements 3 in various embodiments. Although only three elements 3 are shown in FIG. 1B, it should be appreciated that more or fewer than three elements 3 may be mounted to the carrier 2. Further, in some embodiments, the elements 3 may be tested for appropriate electrical functionality before mounting the elements 3 to the carrier 2. In some embodiments, only known good dies (KGDs) may be selected for mounting to the carrier 2. In other embodiments, the dies may be tested for electrical functionality after being mounted to the carrier 2 or after forming RDL. The elements 3 of FIG. 1B comprise integrated device dies having various active (and/or passive) components. In other embodiments, one or more discrete passive devices may be mounted to the substrate without being formed as part of an integrated device die.

The elements 3 can be attached to the carrier 2 using any suitable direct bonding technique to directly bond to the carrier 2 without an intervening adhesive. As shown in FIG. 1B, for example, the element 3 can include a front surface 4 and a back surface 5 opposite the front surface 4. In the embodiment of FIG. 1B, the back surface 5 can be directly bonded to the carrier 2, such that the front surface 4 faces away from the carrier 2. In various embodiments, the front surface 4 of the elements 2 can comprise a plurality of conductive interconnections (e.g., metallic pads or traces) to provide electrical communication between the element 3 and other devices. Typically, active circuitry or devices are disposed at or near the front surface 4. In some embodiments, active circuitry or devices may also be disposed at or near the back surface 5, or between the front and back surfaces 4, 5. In FIG. 1B, non-conductive field regions at the back surfaces 5 of the elements 3 can directly contact and be directly bonded with corresponding non-conductive regions of the carrier 2.

To accomplish the direct bonding, in some embodiments, bonding surfaces of the elements 3 (e.g., the back surfaces 5) and the carrier 2 can be prepared for bonding. The elements 3 can be planarized and/or polished to a very high degree of smoothness (e.g., less than 20 nm surface roughness, or more particularly, less than 5 nm surface roughness, less than 2 nm surface roughness, or less than 0.5 nm surface roughness). In some embodiments, a bonding layer (e.g., a dielectric such as silicon oxide) may be deposited on the bonding sides, e.g., the back surfaces 5 of the elements 3 and/or on the front surface of the carrier 2, and polished to a very high degree of smoothness. In some embodiments, the bonding surfaces may be fluorinated to improve bonding. The bonding surfaces may also include conductive features, such as bond pads, in various arrangements. In some embodiments, the surfaces to be bonded may be terminated with a suitable species and activated prior to bonding. For example, in some embodiments, the surfaces to be bonded may be very lightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch).

Once the surfaces are prepared, the nonconductive field regions at the back surfaces 5 of the elements 3 can be brought into contact with corresponding nonconductive regions of the carrier 2. The interaction of the activated surfaces can cause the nonconductive regions of the elements 3 to directly bond with the corresponding nonconductive regions of the carrier 2 without an intervening adhesive along a bonding interface 9, without application of external pressure, without application of voltage, and at room temperature. Such room temperature, atmospheric or reduced pressure bonding can result in bond strengths of about of at least 500 mJ/m$^2$, at least 1000 mJ/m$^2$, or at least 2000 mJ/m$^2$, for example, in a range of 500 mJ/m$^2$ to 2000 mJ/m$^2$. In various embodiments, the carrier 2 and elements 3 may be heated after bonding to strengthen the bonds between the nonconductive regions to cause the elements 3 to bond with the carrier 2. After annealing, the bond strength can increase to above 2000 mJ/m$^2$, for example, about 2500 mJ/m$^2$. Additional details of direct bonding processes may be found throughout U.S. Pat. Nos. 7,126,212; 8,153,505; 7,622,324; 7,602,070; 8,163,373; 8,389,378; 8,735,219; 9,953,941; and 10,204,893, the contents of each of which are hereby incorporated by reference herein in their entirety and for all purposes.

FIGS. 1C and 1D illustrate alternative methods for molding the partially-formed microelectronic assembly 1 of FIG. 1B. For example, FIG. 1C is a schematic side view of the partially-formed microelectronic assembly 1, in which an overmold or molding compound 6 is provided over a surface of the carrier 2 between and around the elements 3. A plate (not shown) can be provided over the front surfaces 4 of the elements 3, and the molding compound 6 can be flowed between the plate and the carrier 2, such that the molding compound 6 underfills spaces or gaps between adjacent elements 3 and under the plate. The molding compound 6 can accordingly be applied to an area of the exposed surface of the carrier 2 that surrounds the elements 3. Further, as shown, the molding compound 6 can be disposed along and can contact side surfaces 7 of the elements 3, which side surfaces 7 may be defined by bulk semiconductor material. The plate can ensure that the upper surface 12 of the molding compound 6 is generally co-planar or flush with the front surfaces 4 of the elements 3 (for example, within 1 μm, or within 0.25 μm), while direct bonding the elements 3 with the carrier 2 can ensure the back surface 5 are flush with the molding compound 6. For example, in various embodiments, the upper surface 12 of the molding compound 6 can be co-planar with the front surfaces 4 of the elements 3 within about 1 μm. Significantly, the back surface 13 of the mold compound 6 can be co-planar with the back surfaces of the elements 3 within about 1 μm, due to replacement of adhesive with direct bonding. In some embodiments, the co-planarity may be within about 0.05 μm to about 0.15 μm.

The molding compound 6 can comprise an organic filler material (such as an epoxy, a resin, etc.) that can have a flowable state in which the molding compound 6 flows between the elements 3. The molding compound 6 can be cured to form a hardened or cured state. In various embodiments, the molding compound can comprise an epoxy resin, for example, an epoxy resin with filler particles, such as silicon oxide filler particles. As explained above, in other processes in which the elements 3 are adhered to the carrier 2 with an adhesive, the overmolding process can cause the elements 3 to shift, which can cause misalignment when connecting pads to a fanout metallization layer. Beneficially, the embodiments disclosed herein can avoid such lateral shifts of the elements 3 during overmolding, because the direct bond between the elements 3 and the carrier 2 effectively lock the elements 3 in place laterally. Moreover, direct bonding advantageously obviates the use of an adhesive, which can prevent the step that results from the elements 3 sinking into the adhesive and loss of co-planarity, as explained above.

In a variant shown in FIG. 1D, conductive interconnections 8 (e.g., bond pads) can be provided on and can extend above the front surface 4 of the element 3. In FIG. 1D, a plate can be provided over the conductive interconnections 8, and the molding compound 6 can be flowed over the area of the surface of the carrier 2 surrounding the elements 3. As with FIG. 1C, in FIG. 1D, the molding compound 6 can extend along and contact the side surfaces 7 of the elements 3. Moreover, the molding compound 6 can flow between adjacent conductive interconnections 8 at the front surfaces 4 of the elements 3. As with FIG. 1C, the direct bonding of the elements 3 to the carrier 2 can prevent shifting of the elements 3 during overmolding and can prevent the formation of a step between the elements 3 and molding compound 6.

Turning to FIG. 1E, a redistribution layer (RDL) 10 can be provided over the upper surface 12 of the molding compound 6 and over the front surfaces 4 of the elements 3. The RDL 10 can comprise a first surface 13 having finely-spaced electrical interconnections (not shown) that are electrically coupled to the similarly finely-spaced conductive interconnections (such as interconnections 8) at the front surfaces 4 of the elements 3. The finely-spaced interconnections of the RDL 10 can be in electrical connection with a coarser set of interconnections (fanout) at a second surface 14 of the RDL 10. The coarser set of interconnections can be suitable for interconnection with the other circuits, boards, packages, and so forth. In many cases, the RDL 10 may be formed as one or more metallization layers using a lithographic process. In other embodiments, the RDL 10 can be part of a structure that is directly hybrid bonded to the front surfaces 4 of the elements 3 without an intervening adhesive. In various embodiments, the RDL 10 can electrically connect to other devices that are stacked on the element(s) 3. In some embodiments, adjacent elements 3 may remain adjacent to one another after singulation and in common connection to the RDL 10, in which case the RDL 10 can electrically interconnect adjacent elements 3, e.g., first and second microelectronic substrates.

The RDL 10 of FIG. 1E can accordingly enable the fanout of electrical signals from the finely-spaced interconnections at the front surfaces 4 of the elements 3 to coarser interconnections at the second surface 14 of the RDL 10. For example, the conductive interconnections (such as interconnections 8) at the front surfaces 4 of the elements 3 can be spaced by less than 20 μm, or less than 15 μm, or less than 5 μm, e.g., in a range of 1 μm to 20 μm. The coarser interconnections at the second surface 14 of the RDL 10 can have spacings in a range of 5 μm to 20 μm. Moreover, due to co-planarity provided by direct bonding, the RDL 10 can be made thinner than RDLs of other techniques. For example, the RDL 10 of the disclosed embodiments can include metal layers on or within dielectric layers of less than about 5 μm, such as 1-4 μm, or in some embodiments less than about 1 μm. Moreover, the RDL metal lines can have very fine pitch, such as about 10 μm using today's metallization technology for RDL, but can be finer for furture technologies given the precision afforded by direct bonding.

Turning to FIG. 1F, at least a portion of a backside 15 (see FIG. 1E) of the carrier 2 can be removed to form a planarized backside 15' (see FIG. 1F). In the embodiment of FIG. 1F, only a portion of a thickness of the carrier 2 has been removed. The remaining portion of the carrier 2 can serve as at least one of a heat sink, a handle, or a structural support. In various embodiments, the at least a portion of the backside 15 can be removed by lapping, etching, polishing, or any other suitable removal technique. In other embodiments, the carrier 2 can be sacrificial such that the entire carrier 2 can be removed from the molding compound 6 and the elements 3. In embodiments in which the entire carrier 2 is removed, a bonding layer of the elements 3 (such as a silicon oxide layer) and/or the molding compound 6 can serve as a stop (e.g., an etch stop, etc.) for the removal process. In either case, the at least partial removal of the carrier 2 can result in a planar backside (e.g., planarized backside 15' of the carrier 2 or planar bonding surface of the element 3 together with the back surface of the molding compound 6) of the microelectronic assembly 1. The planar backside of the microelectronic assembly 1 can be directly bonded to other devices or elements without an intervening adhesive.

In FIG. 1G, the microelectronic assembly 1' can be singulated through the carrier 2 and the molding compound 6 to form a plurality of microelectronic assemblies 1. For example, the microelectronic assembly 1' can be singulated by sawing through the carrier 2 and the molding compound 6, or just through the molding compound 6 if the carrier was fully removed. After singulation, the molding compound 6 and the RDL 10 can include one or more singulated side surfaces 17 that include markings indicative of a singulation process. For example, the singulated side surfaces 17 can include saw markings. It should be appreciated that although each singulated microelectronic assembly 1 of FIG. 1G includes a single element 3, in other arrangements, the assembly 1 can include a plurality of elements 3 to form a system-in-package. For example, the assembly 1 can include a plurality of elements 3 stacked on one another and/or disposed laterally adjacent to one another.

FIG. 1H illustrates an arrangement in which the carrier 2 has been completely removed from the molding compound 6 and the elements 3. In some embodiments, a majority of the carrier 2 can be removed, except for a bonding layer that may include conductive interconnects embedded in a non-conductive or dielectric region. The carrier 2 can be removed prior to singulation, e.g., prior to the step shown in FIG. 1G. In other embodiments, the carrier 2 can be removed after singulation. In FIG. 1H, each singulated microelectronic assembly 1 can be connected to other structures. For example, each microelectronic assembly 1 can electrically connect to other structures at top or bottom surfaces of the assembly 1. For example, the RDL 10 at upper surfaces of the microelectronic assembly 1 can be electrically connected (e.g., wire bonded, flip chipped, directly hybrid bonded) to other structures, such as other packages, other carriers, other device dies, etc. Sec, for example, FIG. 1J, described in more detail below.

Moreover, the back surfaces 5 of the elements 3 can be electrically connected (e.g., directly bonded) to other structures as well. In such arrangements, back surfaces 5 of the elements 3 can be electrically connected (e.g., directly bonded) to other structures, such as other packages, other dies, other carriers, etc. For example, in various embodiments, singulated packages or microelectronic assemblies 1 can comprise a plurality of elements (e.g., dies) that are electrically connected to one another by way of conductive traces and contacts of the RDL 10. In some embodiments, the back surfaces 5 can include a bonding layer including a nonconductive field region with conductive interconnects defined therein or thereon. The bonding layer (e.g., the nonconductive field region and the conductive interconnects) can be directly bonded to corresponding nonconductive field regions and conductive interconnects of other structures without an intervening adhesive. In various embodiments, for example, the bonding layer can be provided at the back surfaces 5 of the elements 3 by deposing the bonding layer at the back surfaces 5. In other embodiments, the bonding layer of the carrier 2 (which can include nonconductive field regions and conductive contacts) can remain after the at least a portion of the carrier 2 is removed. In such an arrangement, the remaining bonding layer of the carrier 2 can serve to electrically connect to other structures. In still other embodiments in which a portion of the carrier 2 remains connected to the elements 3 and the molding compound 6, the carrier 2 can serve as an interposer to connect to the other structures.

Figure 1I:
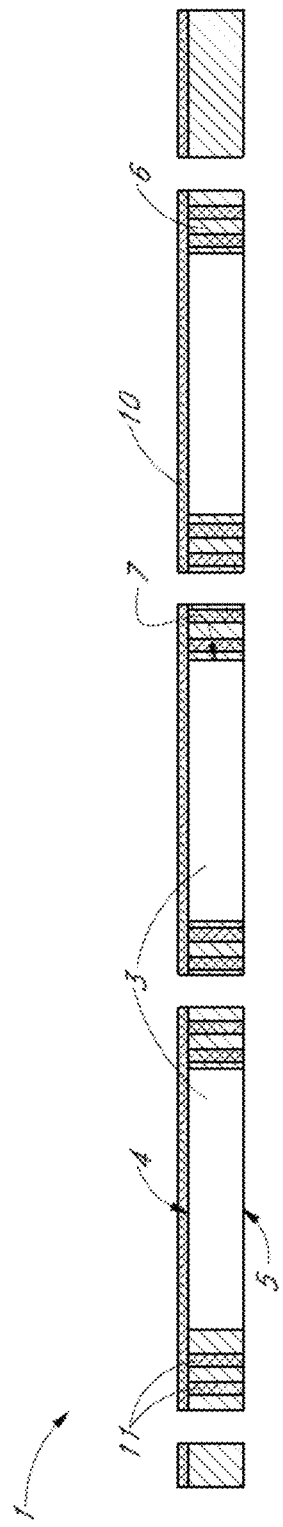
FIG. 1I is a schematic side view of a plurality of microelectronic assemblies including a plurality of through-mold vias.

FIG. 1I is a schematic side view of a plurality of microelectronic assemblies 1 including vias 11 that extend from the RDL 10 through the molding compound 6 to the back surface of the molding compound 6. Thus the illustrated vias 11 can be referred to as through-mold vias. To form the vias 11, one or more cavities can be formed (e.g., etched), and a conductive material can be provided in the cavities to form the conductive vias 11. The vias 11 can provide electrical communication between the RDL 10 and other structures (not shown) which may electrically connect to the back side of the molding compound 6 and elements 3. The vias 11 can be formed at the same time as the RDL layer 10 shown in FIG. 1E. Beneficially, the use of the through-mold vias 11 can be less costly and complicated to manufacture than through-substrate vias, e.g., vias that pass through elements 3. In some embodiments, the elements 3 may not include through-substrate vias. In other embodiments, the elements 3 may include through-substrate vias.

Figure 1J:
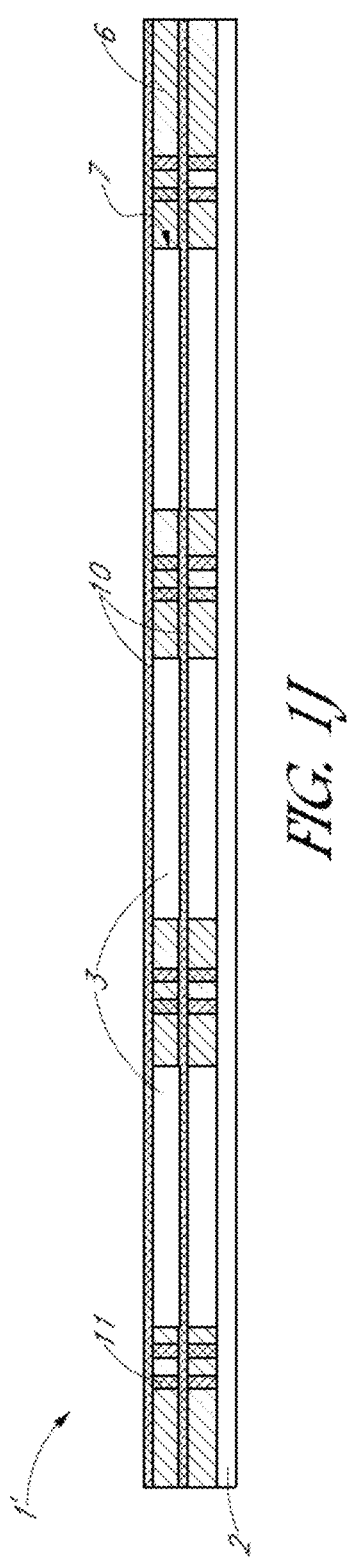
FIG. 1J is a schematic side view illustrating a partially-formed microelectronic assembly that comprises a stacked structure.

For example, as shown in FIG. 1J, the microelectronic assembly 1' can include a plurality of elements 3 stacked on top of one another. In the embodiment of FIG. 1J, for example, the elements 3 can be stacked prior to singulation. Additional elements 3 can be stacked on the lower layer of elements 3 and directly bonded to the RDL 10. Molding compound can be applied between adjacent elements 3 as explained above, and RDL 10 can be provide over the stacked structure. In various embodiments, the adjacent molding compounds can be bonded with any suitable technique, such as, thermocompression bonding, direct bonding without an adhesive, etc. In various embodiments in which the molding compound 6 is direct bonded to vertically adjacent molding compound, a bonding layer (such as a silicon oxide bonding layer) can be applied between adjacent portions of the molding compound 6.

Figure 1K:
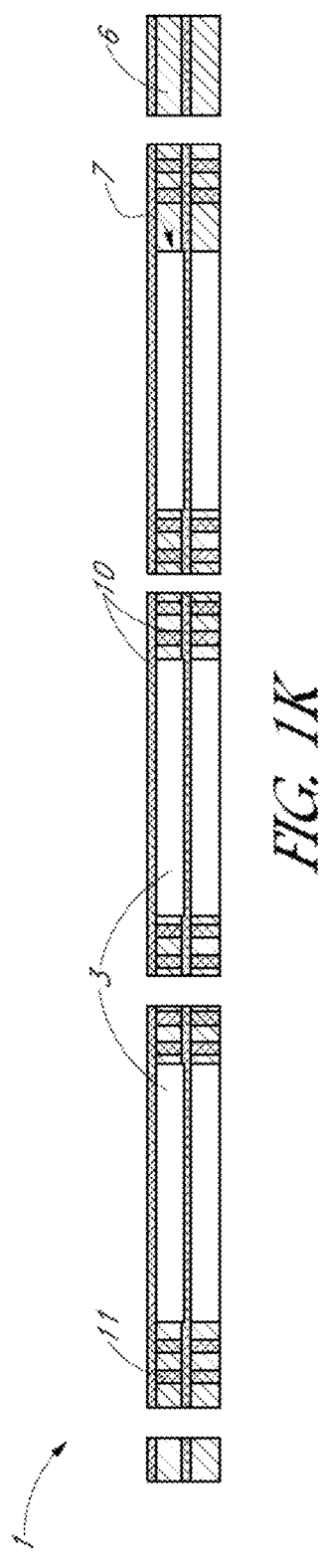
FIG. 1K is a schematic side view illustrating a plurality of singulated microelectronic assemblies comprising stacked structures, according to various embodiments.

In another embodiment, two reconstituted wafers can each be formed, including RDL formation, and direct hybrid bonded to one another. Any suitable number of elements 3 can be stacked on top of one another. The assembly 1' can be subsequently singulated into a plurality of singulated microelectronic assemblies 1 as shown in FIG. 1K. Moreover, as explained above, the carrier 2 can be completely removed in some embodiments, such as that shown in FIG. 1K. In other embodiments, at least a portion of the carrier 2 can remain bonded to the lower layer of elements 3. Although FIG. 1J illustrates stacked elements 3, in other embodiments, the elements 3 may not be stacked. For example, in other embodiments, the singulated assembly 1 may include laterally-spaced elements 3 after singulation, or only one element 3.

Figure 2A:
FIG. 2A is a schematic side view of a carrier, according to another embodiment.
Figure 2B:
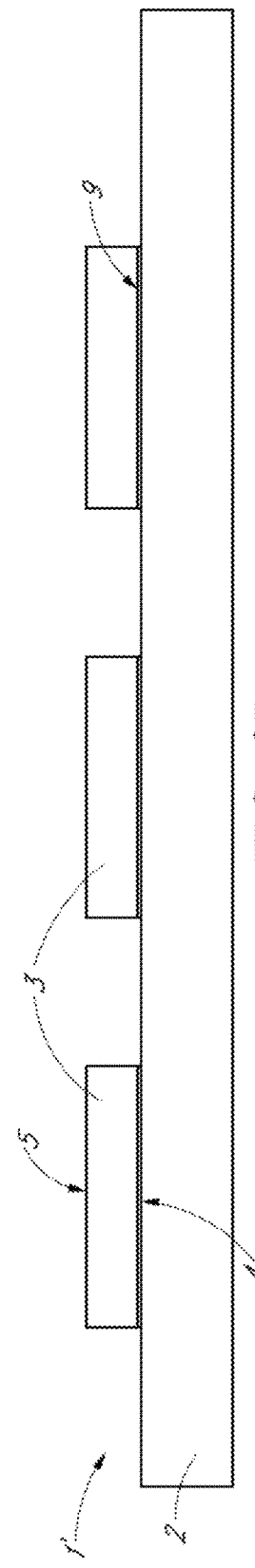
FIG. 2B is a schematic side view of a partially-formed microelectronic assembly including a plurality of elements directly bonded to the carrier without an intervening adhesive.

FIGS. 2A-2H illustrate a face-down method for forming a microelectronic assembly 1, according to various embodiments. Unless otherwise noted, the components of FIGS. 2A-2H may be the same as or generally similar to like-numbered components of FIGS. 1A-1I. For example, as with FIG. 1A, the carrier 2 can be provided in FIG. 2A. The carrier 2 can provide any suitable carrier, as explained above. In FIG. 2B, a plurality of elements 3 can be directly bonded to the carrier 2. However, unlike the embodiment of FIG. 1B, in FIG. 2B, the front surfaces 4 of the elements 3 can be directly bonded to the carrier 2 without an intervening adhesive. As explained above, the front surfaces 4 of the elements 3 can include conductive interconnections (not shown in FIG. 2B) embedded within or surrounded by a nonconductive field region. The conductive interconnections and nonconductive field region can be directly hybrid bonded to corresponding conductive interconnections and nonconductive field region of the carrier 2 along the bonding interface 9. Thus, in FIG. 2B, the front surfaces 4 of the elements 3 can face and be directly bonded to the carrier 2, and the back surfaces 5 can face away from the carrier 2.

Figure 2C:
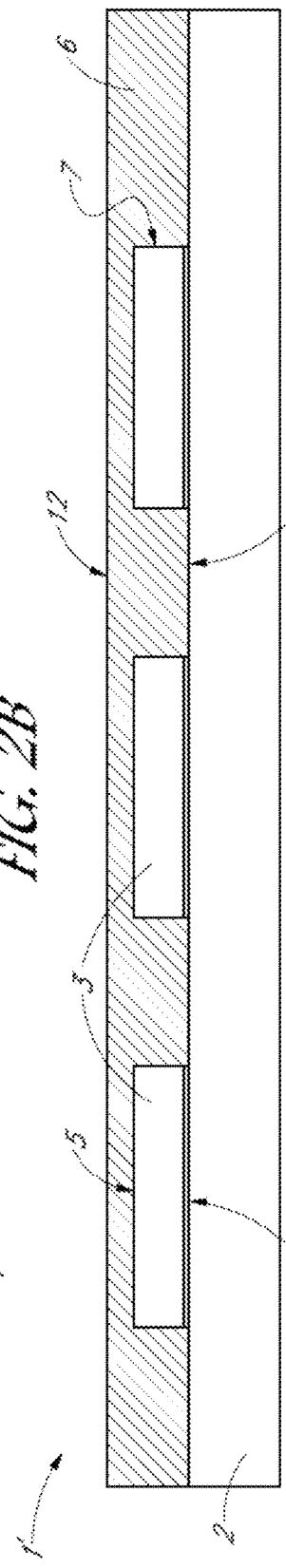
FIG. 2C is a schematic side view showing a molding compound applied over and between the plurality of elements on the carrier.

Turning to FIG. 2C, the molding compound 6 can be applied over the elements 3 and areas of the surface of the carrier 2 between adjacent elements 3. As above, the molding compound 6 can be disposed along an upper surface of the carrier 2 and along side surfaces 7 of the elements 3. The molding compound 6 can comprise a filler material, such as a curable epoxy in various embodiments. Beneficially as explained above, the use of direct bonding to mount the elements 3 to the carrier 2 can prevent the elements from laterally shifting during overmold and can facilitate coplanarity of the molding compound with element surfaces.

Figure 2D:
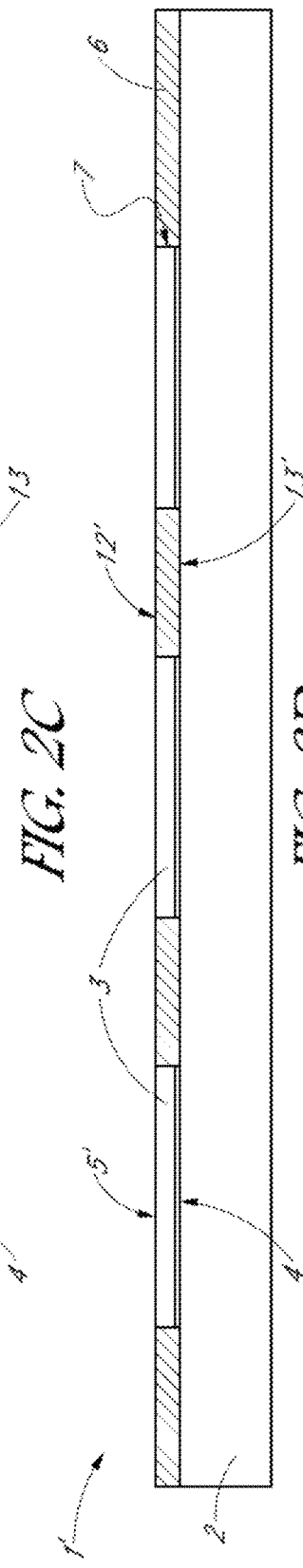
FIG. 2D is a schematic side view of the partially-formed microelectronic assembly of FIG. 2C, after the molding compound and elements have been thinned by a thinning process.

In FIG. 2D, the elements 3 and molding compound 6 can be thinned during a thinning process. For example, in various embodiments, the back surfaces 5 of the elements 3 and the upper surface 12 of the molding compound 6 can be lapped, grinded, or otherwise thinned to form thinned back surfaces 5' of the elements 3 and thinned upper surfaces 12' of the molding compound 6. As with the embodiment of FIGS. 1A-1K, the back surfaces 5' of the elements 3 can be substantially co-planar with the upper surfaces 12' of the molding compound 6, while direct bonding also facilitates co-planarity between the lower surfaces 13' of the molding compound 6 and the front surfaces 4 of the elements 3. Co-planarity can be, for example, within about 1 μm, for example, within about 0.1 μm.

Turning to FIG. 2E, at least a portion of the carrier 2 can be removed from the front surfaces 4 of the elements 3 and the lower surface of the molding compound 6. In some embodiments, the carrier 2 can be completely removed, e.g., removed except for a native oxide layer at the upper surface of the carrier 2). In some embodiments, for example, the carrier 2 can be removed by etching. In such arrangements, the native oxide layer can serve as a stop (e.g., an etch stop) for the removal process. The remaining native oxide layer may be less than 5 nm thick, e.g., 2 nm or less. In other embodiments, in which the carrier 2 includes a relatively thick bonding layer (such as an oxide layer), the majority of the carrier 2 (e.g., the silicon substrate) can be removed while leaving the bonding layer bonded to the elements 3 and the molding compound 6. In such an arrangement, the bonding layer can include contacts or traces within an oxide layer (or other dielectric layer) to serve as a routing layer, which can connect to structures below the front surfaces 4 of the elements 3. Once the at least a portion of the carrier 2 has been removed, the exposed front surfaces 4 can be planar, e.g., having a surface roughness of less than about 1 micron. Moreover, the front surfaces of the elements 3 can be generally co-planar with the exposed lower surface 13' of the molding compound 6, as noted above.

In FIG. 2F, the RDL 10 can be provided over the front surfaces 4 of the elements 3 and over the lower surface 13' of the molding compound 6. The RDL 10 may be generally similar to the RDL 10 described above in connection with FIGS. 1A-1K, and can provide a fanout electrical connection from relatively fine pitches of contacts on the elements 3 to relatively coarse pitches of contacts on a lower surface of the RDL 10, as described above. In FIG. 2G, the partially-formed microelectronic assembly 1' of FIG. 2F can be singulated into a plurality of microelectronic assemblies 1, in a manner similar to that explained above in connection with FIGS. 1A-1K. For example, the molding compound 6 and the RDL 10 can include side surface(s) 17 having markings indicative of a singulation process, such as saw markings. Further, as shown in FIG. 2H, in some embodiments, a plurality of through-mold vias 11 can be provided to provide electrical communication through the molding compound 6. The microelectronic assembly 1 of FIGS. 2I-2J can be stacked or arranged in any other suitable combination, as explained above with respect to FIGS. 1A-1K.

Figure 3:
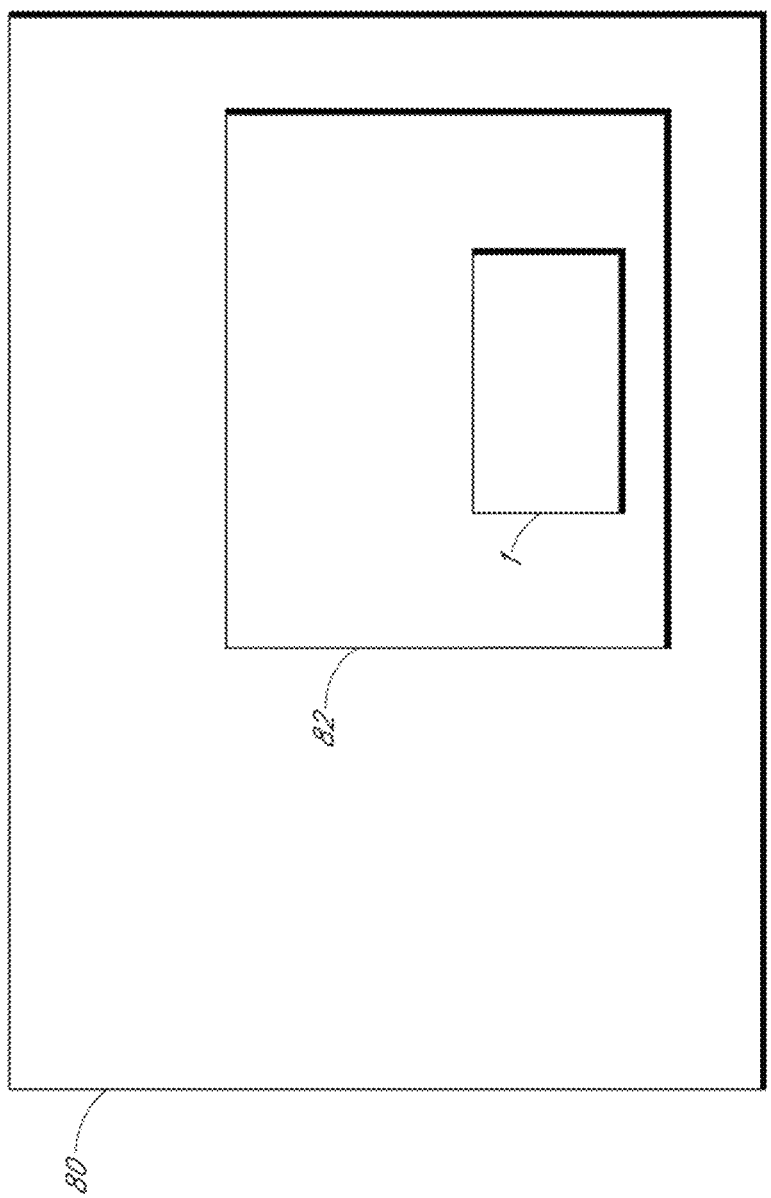
FIG. 3 is a schematic diagram of a system incorporating one or more microelectronic assemblies, according to various embodiments.

FIG. 3 is a schematic diagram of a system 80 incorporating one or more microelectronic assemblies 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more microelectronic assemblies 1. The microelectronic assemblies 1 shown in FIG. 3 can comprise any of the microelectronic assemblies 1 shown and described above in connection with FIGS. 1A-2H. The microelectronic assembly 1 can include one or more integrated device dies which perform various functions for the system 80.

In one embodiment, a method of forming a microelectronic assembly is disclosed. The method can include bonding a first surface of at least one microelectronic substrate to a surface of a carrier using a direct bonding technique without an intervening adhesive, the microelectronic substrate having a plurality of conductive interconnections on at least one surface of the microelectronic substrate. The method can include applying a molding material to an area of the surface of the carrier surrounding the microelectronic substrate to form a reconstituted substrate. The method can include processing the microelectronic substrate. The method can include singulating the reconstituted substrate at the area of the surface of the carrier and at the molding material to form the microelectronic assembly.

In another embodiment, a microelectronic assembly is disclosed. The microelectronic assembly can include an element having a front surface and a back surface opposite the front surface, at least one of the front and back surfaces comprising a planarized direct bonding surface. The microelectronic assembly can include a molding compound disposed around the element, the molding compound disposed along a side surface of the element, the molding compound including a first surface and a second surface opposite the first surface. The microelectronic assembly can include a redistribution layer (RDL) disposed over and electrically connected to the front surface of the element. The first surface of the molding compound can be substantially co-planar with the planarized direct bonding surface.

In another embodiment, a method of forming a microelectronic assembly is disclosed. The method can include directly bonding a first surface of an element to a carrier without an intervening adhesive, the element having a plurality of exposed conductive interconnections on at least one surface of the element. The method can include applying a molding compound around the element and along a side edge of the element. The method can include providing a redistribution layer (RDL) over and electrically connected to the at least one surface of the element. The method can include singulating through the RDL and the molding compound to form the microelectronic assembly.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A method of forming a microelectronic assembly, comprising:
    direct bonding a first surface of a microelectronic substrate to a surface of a carrier, wherein the microelectronic substrate comprises a plurality of conductive interconnections;
    applying a material over the carrier and the microelectronic substrate to form a reconstituted substrate, wherein the material surrounds the microelectronic substrate;

after forming the reconstituted substrate, processing the reconstituted substrate to form a processed reconstituted substrate, wherein processing the reconstituted substrate comprises thinning the reconstituted substrate;

removing the carrier from the processed reconstituted substrate; and after removing the carrier, singulating the processed reconstituted substrate through the material to form the microelectronic assembly.

2. The method of claim 1, wherein applying the material over the carrier and the microelectronic substrate comprises applying the material such that a portion of the material covers a second surface of the microelectronic substrate opposite the first surface.

3. The method of claim 2, wherein thinning the reconstituted substrate comprises removing the portion of the material covering the second surface of the microelectronic substrate.

4. The method of claim 3, wherein thinning the reconstituted substrate comprises thinning the microelectronic substrate to form a post-thinning surface of the microelectronic substrate.

5. The method of claim 1, wherein processing the reconstituted substrate comprises forming a post-processing surface of the processed reconstituted substrate, the method further comprising forming a metallization layer over the post-processing surface.

6. The method of claim 1, further comprising forming one or more cavities in the material and filling the one or more cavities with a conductive material to form one or more conductive vias.

7. The method of claim 1, further comprising forming a metallization layer over the processed reconstituted substrate.

8. The method of claim 7, wherein after removing the carrier from the processed reconstituted substrate, one or more of the plurality of conductive interconnections are revealed and wherein forming the metallization layer over the processed reconstituted substrate comprises forming the metallization layer on the revealed one or more of the plurality of conductive interconnections.

9. The method of claim 1, wherein the microelectronic substrate comprises a second surface opposite the first surface and wherein the plurality of conductive interconnections are positioned closer to the first surface than the second surface.

10. The method of claim 9, wherein removing the carrier from the processed reconstituted substrate comprises removing the carrier from the processed reconstituted substrate to form a third surface of the processed reconstituted substrate.

11. The method of claim 10, wherein the third surface comprises the plurality of conductive interconnects and wherein forming the third surface comprises revealing the plurality of conductive interconnects.

12. The method of claim 10, further comprising adding a routing layer to the third surface of the processed reconstituted substrate.

13. The method of claim 10, wherein removing the carrier from the microelectronic substrate comprises thinning, etching, or grinding the carrier.

14. The method of claim 10, wherein thinning the reconstituted substrate comprises thinning the microelectronic substrate and wherein the processed reconstituted substrate comprises a fourth surface.

15. The method of claim 14, wherein, after removing the carrier, the processed reconstituted substrate comprises vias that extend from the third surface to the fourth surface.

16. The method of claim 1, wherein the microelectronic substrate comprises a first microelectronic substrate, the method further comprising:

direct bonding a second microelectronic substrate to the surface of the carrier, wherein the first and second microelectronic substrate are separated from each other by a gap and wherein applying the material over the carrier comprises at least partially filling the gap with the material.

17. The method of claim 16, wherein singulating the processed reconstituted substrate through the material comprises singulating the processed reconstituted substrate through the material formed in the gap.

18. The method of claim 1, wherein direct bonding the first surface of the microelectronic substrate to the surface of the carrier comprises direct bonding the first surface of the microelectronic substrate to the surface of the carrier without an adhesive and at ambient conditions.

19. The method of claim 1, wherein direct bonding the first surface of the microelectronic substrate to the surface of the carrier comprises direct bonding the microelectronic substrate face down onto the carrier.

20. The method of claim 1, wherein direct bonding the first surface of the microelectronic substrate to the surface of the carrier comprises direct bonding the microelectronic substrate face up onto the carrier.

* * * * *